United States Patent [19]

Brower et al.

[11] 4,306,855
[45] Dec. 22, 1981

[54] PHOTOFLASH UNIT HAVING REFLECTOR WITH OPENINGS SURROUNDED BY TRANSPARENT REGIONS

[75] Inventors: Boyd G. Brower; John W. Shaffer, both of Williamsport, Pa.

[73] Assignee: GTE Products Corporation, Stamford, Conn.

[21] Appl. No.: 114,857

[22] Filed: Jan. 24, 1980

[51] Int. Cl.³ ............................ F21K 5/02; F21V 7/00
[52] U.S. Cl. ..................... 431/359; 362/350; 362/15
[58] Field of Search ................. 431/359, 364, 365; 361/264; 362/6, 15, 16, 349, 350

[56] References Cited

U.S. PATENT DOCUMENTS 3,738,791  6/1973  Cressman ........................ 431/359
4,036,578  7/1977  Herman .......................... 431/359
4,155,110  5/1979  Armstrong et al. ............... 362/16

Primary Examiner—Samuel Scott
Assistant Examiner—Randall L. Green
Attorney, Agent, or Firm—Lawrence R. Fraley

[57] ABSTRACT

An improved photoflash unit comprising a circuit board with lamp-firing circuitry thereon, a plurality (e.g., ten) of electrically activated photoflash lamps, and a reflector located between the lamps and circuitry. The lamp-firing circuitry includes at least one switch which is activated by radiant energy emitted from an adjacent photoflash lamp. The improvement comprises providing at least one longitudinal opening (slot) within a cavity portion of the reflector between the activating lamp and switch, and surrounding the opening with a transparent, non-conductive region to thereby assure consistent switch activation by substantially eliminating arcing between the reflector and circuitry.

10 Claims, 5 Drawing Figures

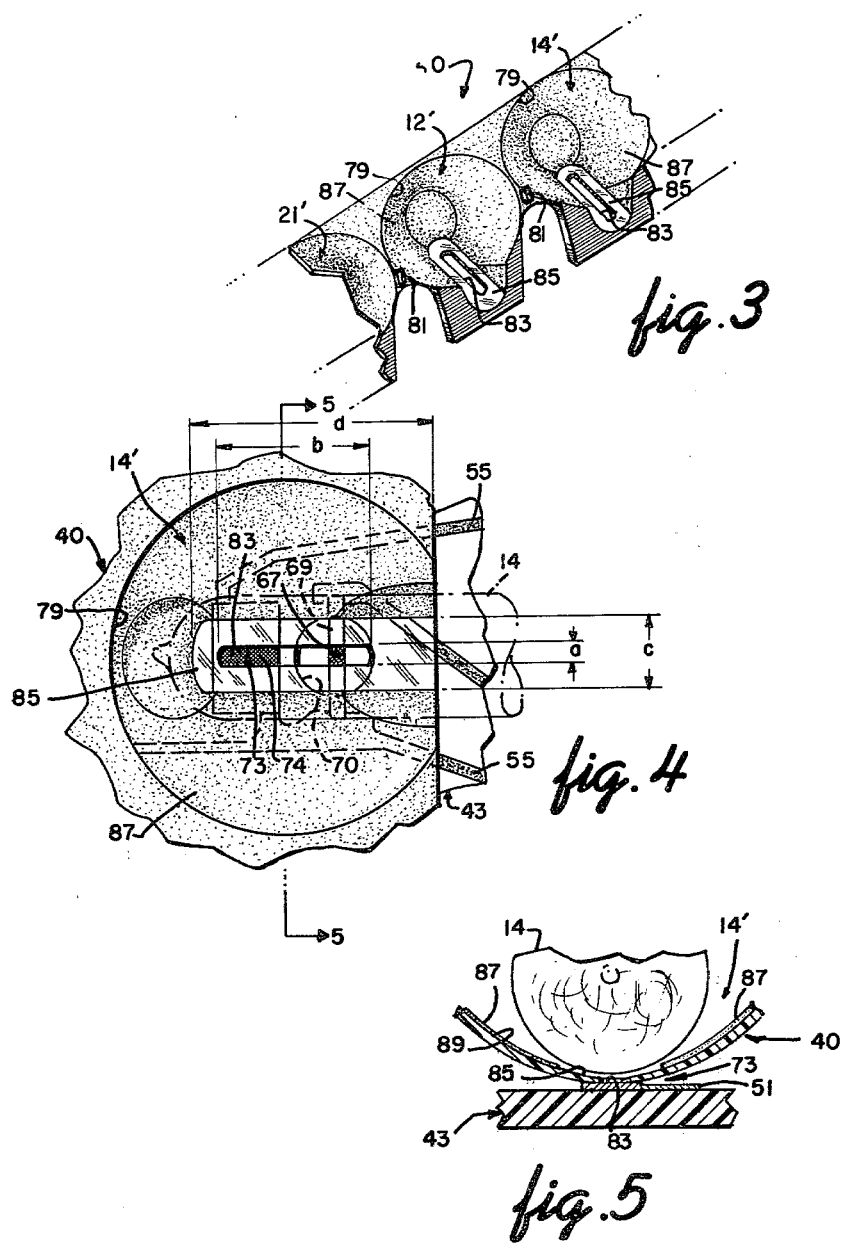

PHOTOFLASH UNIT HAVING REFLECTOR WITH OPENINGS SURROUNDED BY TRANSPARENT REGIONS

DESCRIPTION

TECHNICAL FIELD

The present invention relates to photoflash units and particularly to multilamp photoflash units wherein the lamps are electrically activated in a sequential manner. Even more particularly, the invention relates to units of the aforedescribed variety which include a reflector therein located between the unit's lamps and the circuitry utilized to activate the lamps.

BACKGROUND

Several multilamp arrangements employing various types of sequencing circuits have been described in the prior art, particularly in the past few years. A currently marketed photoflash unit, referred to as a flip flash, employs high-voltage type lamps adapted to be ignited sequentially by successively applied high-voltage firing pulses from a source such as a camera-shutter-actuated piezoelectric element. One type of flip flash unit comprises an elongated planar array of eight high-voltage type flashlamps mounted on a printed circuit board with an array of respectively associated reflectors disposed therebetween. The lamps are arranged in two groups of four disposed on the upper and lower halves respectively of the rectangular shaped circuit board. A set of terminal contacts at the lower end of the unit is provided for activation of the upper group of lamps, while a set of terminal contacts at the top of the unit is operatively associated with the lower group of four lamps. The application of successive high-voltage pulses (e.g., 500 to 4,000 volts from, say, a piezoelectric source controlled by the shutter of a camera in which the array is inserted) to the terminal contacts at the lower end of the unit causes the four lamps at the upper half of the array to be sequentially ignited. The array may then be turned end for end and again inserted into the camera in order to flash the remaining four lamps.

The circuit board used in the aforedescribed flip flash unit comprises a sheet of plastic having a pattern of conductive circuit traces, including the terminal contacts, on one side. The flashlamp leads are electrically connected to these circuit traces (e.g., by means of metal eyelets). The circuitry on the board includes six printed, normally open, connect switches that chemically change from a high to lower resistance, so as to become electrically conducting after exposure to the radiant energy from an ignited flashlamp operatively associated therewith. The purpose of these switches is to provide lamp sequencing and one-at-a-time flashing. The four lamps of each group are arranged in parallel with three of the four lamps being connected in series with their respective thermal connect switches. Initially, only the first of the group of four lamps is connected directly to the voltage pulse source. When this first group flashes, it causes its associated thermal connect switch (which is series connected with the next or second lamp) to become permanently conductive. Because of this action, the second lamp of the group of four is connected to the pulse source. This sequence of events is repeated until all four lamps have been flashed.

One problem experienced in circuits of the above variety is that if one lamp should short circuit internally upon flashing, the successive parallel lamps in the group of four will not flash. Accordingly, the remaining, unfired lamps are shorted. It has been found that this problem can be eliminated by the use of a radiant-energy-activated switch that is normally conducting and which becomes nonconducting subsequent to exposure to the actinic output of the flashlamp associated therewith. This disconnect switch is used in series with each of the lamps, except the last lamp, in a sequentially flashing parallel group of high voltage flashlamps. It may be used, if desired, in addition to the printed connect switches, which are normally open and which close upon actinic exposure. Hence, the modes of action of these two types of switches are opposite from one another—the disconnect switch interrupts the igniting circuit of the lamp in series with it upon firing of that lamp, while the thermal connect switch establishes the igniting circuit for the next lamp upon being activated.

A more recent version of the aforedescribed multilamp unit comprises a total of ten lamps arranged horizontally in two parallel columns, the lamps of one column being staggered relative to the lamps of the other column with the bases interdigitated and facing the adjacent column. A multiple reflector system for the lamps comprises a pair of adjacent strip-like reflector panels each having a column of side-by-side reflector cavities aligned with an associated column of lamps, the cavities of one panel being staggered with respect to the cavities of the other panel. Each panel is foreshortened with respect to the lamps associated therewith but covers the lead-in wires and substantial portions of the bases of lamps associated with the adjacent reflector panel. In this manner, the lead-in wires and base portions of lamps associated with one panel underlie the adjacent panel to be hidden thereby. This ten lamp unit also includes a circuit board and associated lamp-firing circuitry. Additionally, this latter unit may include both types of the aforedescribed switch members.

Examples of the above, eight lamp photoflash units are shown and described in U.S. Pat. Nos. 3,894,226 (Hanson), 4,047,015 (Blount), and 4,053,757 (Blount). A somewhat modified version of this product is described in U.S. Pat. No. 4,133,023 (Hanson) wherein horizontally oriented lamps are utilized. An example of a more recent ten lamp embodiment is shown and described in U.S. Pat. No. 4,164,007 (E. G. Audesse et al). Radiant energy activated switches which become conductive or non-conductive in response to receipt of the lamp's energy are shown and described in U.S. Pat. No. 4,130,857 (Brower).

It has been found that arcing can occur in the above units between the reflector and circuitry (including the switches forming a part thereof) which results in the conductive reflector serving as a ground to thus prevent firing pulses from reaching subsequent, unfired lamps. Arcing occurs primarily through openings located in the reflector, these openings provided for passage of radiant energy from the fired lamp to the respective switch member(s). The reflector, typically of a plastic material having a conductive, reflecting coating (e.g., aluminum) thereon, is located adjacent to (and in the case of the ten lamp versions, in contact with) the circuit board and its circuitry. To prevent such arcing, some units have utilized a totally nonconductive reflector (see U.S. Pat. No. 4,133,023 above) while others have taught using a layer of insulative material between the reflector and circuit board (see U.S. Pat. No. 3,894,226 above). Nonconductive reflectors have not proven acceptable because the reflecting materials (e.g., white enamel) used thereon lack the reflecting capability desired for photoflash products such as described above. Use of a layer of insulative material is also considered disadvantageous in view of the added costs thereof.

It is believed therefore that a photoflash unit which utilizes a reflector which in turn overcomes the aforementioned disadvantages of known reflectors would constitute an advancement in the art.

DISCLOSURE OF THE INVENTION

It is a primary object of this invention to enhance the photoflash art by providing an improved photoflash unit wherein the improvement comprises a reflector which substantially eliminates arcing and the several problems associated therewith.

This and similar, additional objects are achieved in one aspect of the invention by the provision of a photoflash unit comprising a circuit board having lamp-firing circuitry on a surface thereof, at least one radiant energy activated switch, a plurality of photoflash lamps, one of which is adapted for activating the switch upon flashing thereof, and a reflector located between the lamps and circuit board. The improvement comprises providing the reflector with a cavity portion having an opening therein surrounded by a non-conductive, transparent region. This unique arrangement permits passage of radiant energy from the activating lamp to the switch while at the same time substantially assuring prevention of arcing between the reflector's conductive coating and adjacent circuitry.

BRIEF DESCRIPTION OF THE DRAWINGS

FIG. 3 is a partial perspective view of a reflector in accordance with a preferred embodiment of the invention;

FIG. 4 is an enlarged partial plan view of one of the reflecting cavities of the reflector of FIG. 3, showing its position in the unit of FIG. 1 relative to the associated lamp and circuit board components; and FIG. 5 is a partial elevational view, enlarged and in section, of the reflector, lamp, and circuit board components illustrated in FIG. 4 as taken along the line 4—4 therein.

BEST MODE FOR CARRYING OUT THE INVENTION

Figures 1, 2:
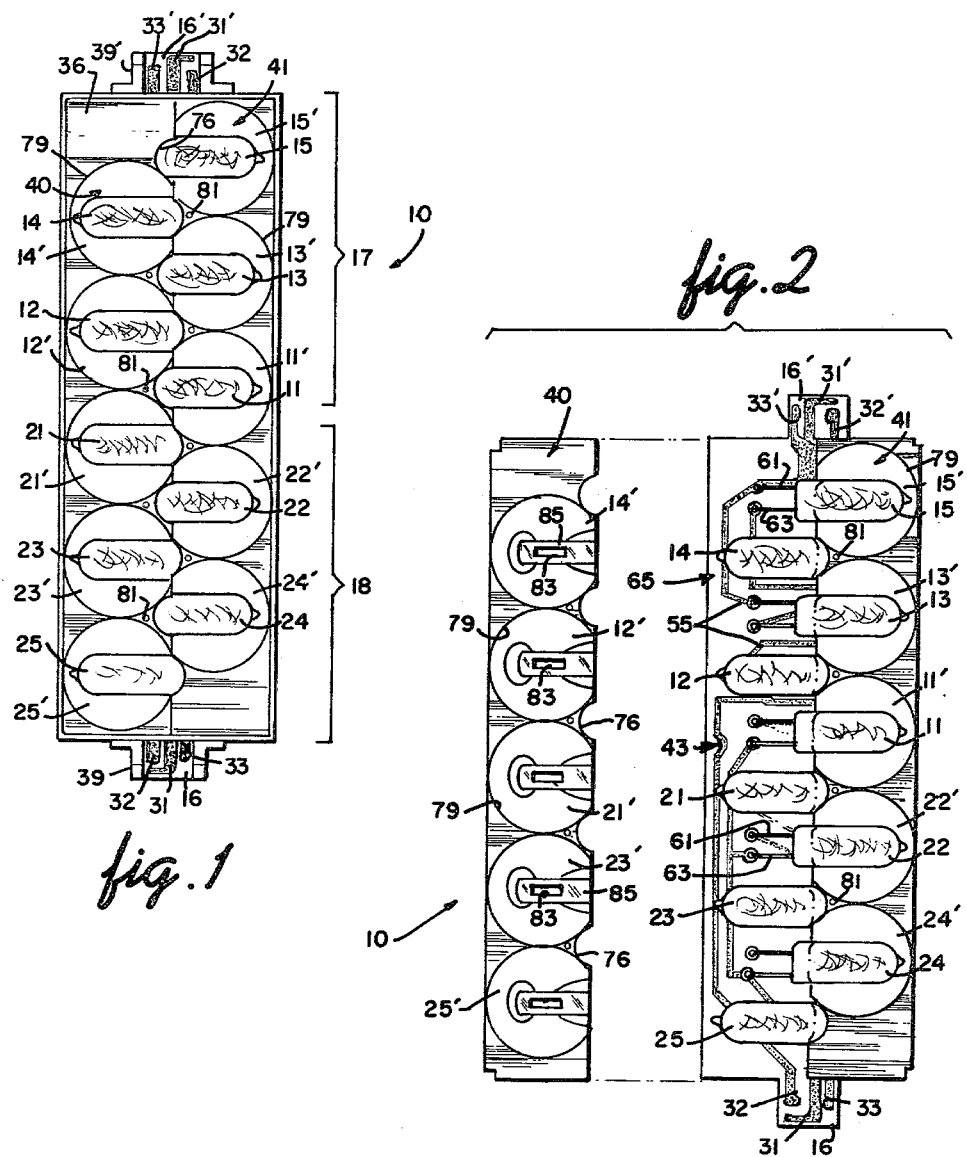
FIG. 1 is a front elevational view of a photoflash unit in accordance with one embodiment of the invention.
FIG. 2 is an exploded front elevational view of the photoflash unit of FIG. 1, excluding the unit's front and back housing members.

For a better understanding of the present invention together with other and further objects, advantages and capabilities thereof, reference is made to the following disclosure and appended claims in connection with the above-described drawings.

The concepts of the present invention are especially applicable to photoflash units of the variety defined above, and most particularly to the more recent ten lamp versions such as described in U.S. Pat. No. 4,164,007. Accordingly, FIGS. 1 and 2 illustrate portions of a multilamp photoflash unit 10 similar in general operation to that described in U.S. Pat. No. 4,164,007. Unit 10 comprises a planar array of ten high-voltage flashlamps 11-15 and 21-25 mounted on a printed circuit board 43, with an array of respectively associated reflector cavities 11'-15' and 21'-25' disposed therebetween. The lamps are mounted in two parallel columns, and the reflector cavities are provided on a pair of strip-like insulative (e.g., polystyrene) panels 40 and 41 which are conveniently separable for assembly purposes and have a conductive, reflective coating thereon. The array is provided with a plug-in connector tab 16 at the lower end thereof which is adapted to fit into a camera or flash adapter (not shown). A second plug-in connector 16' is provided at the top of the unit, whereby the array is adapted to be attached to the camera socket in either of two orientations (e.g., with either the tab 16 or the tab 16' plugged into the socket). The lamps are arranged in two groups (17, 18) of five disposed on the upper and lower halves respectively, of the elongated, rectangular-shaped array. Upper group 17 comprises lamps 11-15, and lower group 18 includes lamps 21-25. The reflector cavities are disposed behind the respective lamps so that as each lamp is flashed, light is projected forward of the array. The lamps are arranged and connected so that when the array is connected to a camera by the connector tab 16, only the upper group 17 of lamps will be sequentially flashed, and when the array is turned end for end and connected to the camera by the other connector tab 16', only the then upper group 18 of the lamps will be sequentially flashed. By this arrangement, only lamps relatively far from the camera lens axis are flashable, thus reducing the well known, undesirable red-eye effect.

The construction of the array includes front and back housing members (only the front housing is shown in FIG. 1 and represented by the numeral 36) which preferably are made of plastic and are provided with interlocking members which are molded integrally within the housing members and which lock these members together in final assembly to form a unitary flash array structure. In the preferred embodiment as shown, the front (or cover) housing member is of rectangular concavity and the back housing member is substantially flat and includes integral extensions 39 and 39' (FIG. 1) at the ends thereof which partly surround and protect the connector tabs 16 and 16' and also function to facilitate mechanical attachment to the camera socket. Sandwiched between the front and back housing members are flashlamps, the pair of adjacent strip-like reflector panels 40 and 41, and printed circuit board 43 provided with integral connector tabs 16 and 16'. In addition to these components, an indicia sheet may also be used, said sheet typically located between the circuit board and back housing components. The indicia sheet may be provided with information, trademarks, and other indicia such as flash indicators located behind the respective lamps which change color due to heat and/or light radiation from an adjacent, flashed lamp to thus indicate to the unit's user which of the lamps have been flashed.

The rear housing member is transparent (either of clear material or provided with window openings) to permit viewing of the information on the described indicia sheet. The front housing is also transparent, at least in front of the lamps, to permit light from the flashing lamps to emerge forwardly of the array. This housing may be tinted to alter the color of the light from the flashlamps.

The height and width of the rectangular array are substantially greater than its thickness, and the height and width of the reflector panels, insulating sheet, and circuit board are substantially the same as the interior height and width of the front housing member to facilitate holding these parts in place.

Each of the flashlamps utilized in the ten-lamp configuration of the present invention preferably includes a tubular envelope of type 0010 or 0120 soft glass having a thickness of about 32 mils and a diameter of about 0.325 inch for the finished (coated) lamp, a length of about 0.925 inch (thus slightly shorter than flashlamps used in previous eight-lamp arrays), an internal volume of about 0.4 cc, an oxygen pressure of 725 cm Hg (9.5 atmospheres), and a shredded zirconium fill of about 14 mgs. Typical unit package dimensions are as follows: overall width of the unit, about 1.75 inches; thickness about 0.56 inch; and overall length (not including extensions 39 and 39'), about 4.94 inches. The unit's length including these extensions is about 5.47 inches.

Tab 16, forming an integral part of circuit board 43, is provided with electrical circuit terminals 31, 32 and 33. Similarly, tab 16' is provided with terminals 31', 32' and 33'. The function of these terminals is to connect the lamp-firing circuitry 55 of board 43 to corresponding terminals in a camera socket whereas firing voltage pulses can be applied to the array. The terminals 31 and 31' are shown as having a substantially J-shaped configuration for temporarily shorting the socket terminals while the array is being plugged in and therefore discharge any residual voltage charge in the firing pulse source. In addition, this serves to reduce the likelihood of lamps being accidentally flashed by electrostatic voltage during handling of the array.

As stated, circuit board 43 includes a "printed circuit" (lampfiring circuitry 55) thereon for causing sequential flashing of the unit's lamps by firing voltage pulses applied to the terminals 31, 32, 33 or 31', 32', 33'. Circuitry 55 functions substantially similar (with differences noted below) to that described in the aforementioned U.S. Pat. No. 4,164,007. Accordingly, the top and bottom halves of the circuitry are preferably reverse mirror images of each other. The lead-in wires 61 and 63 of each of the lamps are preferably attached to the circuit board in accordance with the teachings described in copending application Ser. No. 078,353, filed Sept. 24, 1979. These wires underlie reflector panels 40 and 41. As defined in Ser. No. 078,353, the lead-in wires of each lamp are secured within the board's substrate member 65 and electrically connected to circuitry 55 at desired locations thereof. This securement and connection is not shown in the drawings for purposes of clarity.

As will be further described below, circuitry 55 of board 43 includes radiation activated switches (FIG. 4) which are in contact with and bridge designated circuit runs. It is preferred in unit 10 to utilize two types of such switches, those defined as "quick disconnect" or normally closed switches and those defined as "radiation connect" or normally open switches. With reference to FIG. 4, there is shown a quick disconnect switch 67 which preferably comprises a length of electrically conductive, heat shrinkable, polymeric material which is attached to the circuit board 43 at both ends, with its midportion spatially suspended to avoid contact with the heat absorbing surfaces of the circuit board. This arrangement maximizes the speed with which the shrinking and separation of the midportion of the switch element occurs upon its being heated by the radiant output of an ignited flashlamp (shown). More specifically, referring to the embodiment illustrated in FIG. 4, the disconnect switch comprises a thin strip 69 of plastic preferably fabricated from mono- or biaxially oriented polyethylene, polypropylene, polystyrene, polyester or nylon. The polymeric material itself may be rendered electrically conductive by additives such as carbons, or as illustrated, it may be rendered surface conductive by deposition of conductive layers thereon. Such conductive surface layers may be attained, e.g., by a vacuum metallization, electroless plating, printing, or coating using conductive inks, or by screen printing or by otherwise applying a conductive path across the switch defined by the polymeric film. The performance of highly reflective materials, such as aluminized polypropylene, can be enhanced by applying a coating or spot of dark, light absorbing ink or other similar material onto the surface facing the flashlamp. The piece of switch material may be self-adhesive, such as a tape, and pressure applied to attach both ends of the strip to the circuit board as illustrated. Each attached strip is located so that it bridges a respective aperture 70 provided in the circuit board. For silk screened circuitry, it is advantageous to carry the circuit pattern over the ends of the preapplied switch strip. In this manner the circuit material helps to anchor the switch ends to the circuit board substrate, in addition to providing electrical connection of both ends of the switch strip into the printed circuit.

As further shown in FIG. 4, a radiation connect switch 73 is also preferably employed as part of circuitry 55 and is located adjacent switch 67, both of these switches capable of being properly activated by the radiant energy emitted from an adjacent flashlamp (e.g., 14). A suitable material 74 for switch 73 is silver oxide dispersed in a binder such as polyvinyl resin. Each of the radiation switches 73 used in unit 10, upon receiving heat and/or light radiation from the adjacent lamp when it is flashed, changes from an open circuit or high resistance to a closed circuit or low resistance between its switch terminals on the circuit board.

It is understood from the foregoing description that a total of eight connect switches 73 and a similar number of disconnect switches 67 are used in the ten lamp unit illustrated in FIGS. 1 and 2, with each of said switches located in circuitry 55 adjacent a respective lamp and capable of functioning in the manner defined to assure orderly, sequential flashing of all of the unit's lamps as intended. Because this manner of operation has been defined to some extent above and also in the known, aforedescribed art, further definition is not deemed necessary. It is noted, however, that in the broadest aspects of the invention, only one such switch need be defined as constituting part of circuitry 55. Understandably, this switch would serve to connect at least two lamps, and therefore the invention need only be further defined in terms of such a number of lamps. The only remaining component needed to complete the invention in its broadest aspects is a reflector.

As illustrated in FIGS. 1 and 2, the lead-in wires and base portions of all lamps associated with reflector panel 41 underlie the adjacent panel 40 to be hidden thereby, and the lead-in wires and bases of the lamps associated with panel 40 underlie adjacent panel 41 to be hidden thereby. In order to assure yet additional maximization of light output, each of the reflector panels may also have a plurality of cut-outs 76 located along the edge thereof facing the adjacent panel and respectively aligned with the individual reflector cavities of that adjacent panel for exposing light-emitting portions of the lamps adjacent to the covered bases thereof. More specifically, the cut-outs 76 along the edge of each panel comprise arcuate recesses between substantially circular apertures 79 defining the outer extremities of each reflecting cavity.

Reflector panels 40 and 41 are preferably provided with conductive projections 81 which are disposed on the front face of each panel between the circular apertures and adjacent the arcuate recesses 76. These projections fit through openings in the front face of the front housing member 36. As each reflector panel has a conductive metallic coating 87 (e.g., aluminum) over most of its front surface which may be connected, such as by a wire (not shown), to the ground circuit including terminals 31 and 31', the projections 81 provide static grounding protection for the unit by assuring electrical contact with any charged object, such as a user's hand, which may touch the front of the array housing.

As stated, arcing presented a problem in known photoflash units having a reflector oriented between the lamp and lamp-firing circuitry wherein the reflector was electrically conductive (e.g., had a conductive, reflective coating on its upper, lamp-facing surface). This arcing occurred between the circuitry, especially the radiant switches, and the conductive coating, thus preventing firing of the remaining, unflashed lamps. As also stated, this arcing occurred through the relatively large openings necessary for passage of radiant energy needed to activate the switches located adjacent the respective lamp but separated by the reflector.

The above problem has been substantially eliminated by the teachings of the present invention without a significant reduction in the reflecting capabilities of the reflector or of the passage of radiant energy. More consistent switch operation has thus been achieved in comparison to known, existing units.

As illustrated in FIGS. 2–4, each cavity (only cavities 21', 12', and 14' are shown in FIG. 3) of the respective reflector panel (e.g., 40) is provided with a narrow opening 83 therein of sufficient size to permit radiant energy from the respective lamp (e.g., 14) to pass therethrough and activate both switches 67 and 73 upon flashing thereof. Opening 83 is surrounded by a transparent, non-conductive region 85 within the reflector's cavity as defined by the conductive, non-transparent aluminum coating 87 located on the cavity's upper (lamp-facing) surface 89. This unique orientation of opening and transparent region prevents arcing between the coating's edges and circuitry (e.g., switch 73) located immediately adjacent lamp 14 and in contact with the underside (non-conductive) of the reflector panel while surprisingly assuring adequate passage of energy to achieve consistent switch activation. In addition, the relatively narrow opening and surrounding region uniquely serve to "shade" the normally open switch 73 from excessive heat as occasionally emitted by what is termed in the art as a "hot" lamp. "Hot" lamps may result during lamp manufacturing wherein excessive combustible material and/or combustion-supporting atmosphere are permitted to enter the lamp. High heat output may also result from abnormal concentrations of combustible material within the lamp's envelope, if such concentrations align above either of the switch members in the final product.

Transparent region 85 is provided in the respective reflector cavities by masking this region prior to application of the aluminum reflective coating.

Opening 83 is shown in FIGS. 2–4 as comprising a longitudinal slot while the surrounding transparent region is of an elongated configuration. The slot is further illustrated as being centrally positioned within region 85. This relationship permits the slot to not only align with both switches 67 and 73 but also to substantially bisect each. This was found to be especially significant with regard to the normally closed switch 67 as it prevented "tailing back" of the non-burned strip 69 during activation thereof. Tailing back has occurred in known, earlier units and occasionally resulted in the unburned ends of the switch's strip physically engaging the conductive coating or lying very close thereto. Arcing was still able to occur in such instances. It is also shown in the drawings that transparent region 85 also aligns with both switches 67 and 73, thus assuring passage of radiant energy in the form of light to impinge on these components. Passage of radiant energy is additionally facilitated by tapering of the walls of the cavity toward opening 83 (see FIG. 5). This latter feature further serves to reduce the overall thickness of unit 10. Longitudinal slots 83 each have a width (dimension a) of about 0.050 inch and a length (dimension b) of about 0.330 inch, while surrounding region 85 has a width (dimension c) of about 0.224 inch and length (dimension d) of about 0.605 inch. The thickness of the cavity at opening 83 is only about 0.005 inch. As shown in FIG. 5, the bottom edges of the openings (those nearest switch 73) physically contact the switch. In dual switch embodiments such as shown in FIG. 4, these edges physically engage the upper surfaces of both switches. The uniqueness of the present invention is thus further emphasized when considering the extremely close positioning relationship of the current-carrying members of unit 10.

There has been shown and described a new and unique means of preventing arcing between a reflector's conductive coating and lampfiring circuitry in a multilamp photoflash unit. This feature is provided without requiring additional components such as insulative sheets, or removal of the highly desirable aluminum reflective material and replacement thereof with a material possessing inferior reflecting properties.

While there have been shown and described what are at present considered the preferred embodiments of the invention, it will be obvious to those skilled in the art that various changes and modifications may be made therein without departing from the scope of the invention as defined by the appended claims.

What is claimed is:

1. In a photoflash unit comprising a circuit board having lamp-firing circuitry located on a surface thereof and including at least one switch for being activated upon receipt of radiant energy in the form of light and/or heat from a photoflash lamp, a plurality of electrically activated photoflash lamps electrically connected to said lamp-firing circuitry for being fired in a sequential manner, at least one of said photoflash lamps adapted for activating said switch upon firing of said lamp, and a reflector positioned between said photoflash lamps and said lamp-firing circuitry, the improvement wherein said reflector comprises at least one cavity portion for having said photoflash lamp adapted for activating said switch positioned therein, said cavity portion including an opening therein oriented between said activating photoflash lamp and said switch, said opening surrounded by a transparent, non-conductive region.

2. The improvement according to claim 1 wherein said reflector is of electrically insulative material and includes an electrically conductive reflective coating on a surface thereof adjacent said photoflash lamps, said coating within said cavity portion defining said transparent, non-conductive region surrounding said opening.

3. The improvement according to claim 2 wherein said cavity portion of said reflector physically contacts said lamp-firing circuitry located on said surface of said circuit board.

4. The improvement according to claim 3 wherein the edges of said opening located on the side of said cavity portion of said reflector adjacent said lamp-firing circuitry physically contact said switch.

5. The improvement according to claim 3 wherein said lamp-firing circuitry further includes a second switch for being activated by the radiant energy from said activating photoflash lamp, both of said switches located adjacent each other on said surface of said circuit board, said opening oriented within said cavity portion between said activating photoflash lamp and both of said switches.

6. The improvement according to claim 5 wherein the edges of said opening located on the side of said cavity portion of said reflector adjacent said lamp-firing circuitry physically contacts both of said switches.

7. The improvement according to claim 1 wherein said opening is substantially centrally positioned within said transparent, non-conductive region.

8. The improvement according to claim 1 wherein said transparent, non-conductive region is of a substantially elongated configuration and said opening is a longitudinal slot.

9. The improvement according to claim 8 wherein said longitudinal slot is substantially centrally positioned within said elongated transparent, non-conductive region.

10. The improvement according to claim 1 wherein the walls of said cavity portion of said reflector are tapered toward said opening.

* * * * *